(12) United States Patent
Cai et al.

(10) Patent No.: US 12,575,307 B2
(45) Date of Patent: Mar. 10, 2026

(54) DISPLAY PANEL, CIRCUIT BOARD, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Jianchang Cai, Beijing (CN); Chao Wu, Beijing (CN); Feng Wei, Beijing (CN); Yuanyou Qiu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 846 days.

(21) Appl. No.: 17/785,196

(22) PCT Filed: May 13, 2021

(86) PCT No.: PCT/CN2021/093623
§ 371 (c)(1),
(2) Date: Jun. 14, 2022

(87) PCT Pub. No.: WO2021/258903
PCT Pub. Date: Dec. 30, 2021

(65) Prior Publication Data
US 2023/0015549 A1 Jan. 19, 2023

(30) Foreign Application Priority Data
Jun. 22, 2020 (CN) .......................... 202010574749.2

(51) Int. Cl.
*H10K 59/131* (2023.01)
*H01L 23/00* (2006.01)
(Continued)

(52) U.S. Cl.
CPC ............. *H10K 59/88* (2023.02); *H01L 24/06* (2013.01); *H01L 2224/06155* (2013.01);
(Continued)

(58) Field of Classification Search
CPC .. H10K 59/12; H10K 59/127; H10K 59/1275; H10K 59/131; H10K 59/179;
(Continued)

(56) References Cited

U.S. PATENT DOCUMENTS 6,831,622 B2* 12/2004 Aoki .................... G09G 3/3688
345/87
9,761,560 B2* 9/2017 Lee ..................... G02F 1/13452
(Continued)

FOREIGN PATENT DOCUMENTS

| CN | 1542506 A | 11/2004 |
| CN | 109407425 A | 3/2019 |

(Continued)

OTHER PUBLICATIONS

CN202010574749.2 first office action.

*Primary Examiner* — Eduardo A Rodela
(74) *Attorney, Agent, or Firm* — IPro, PLLC

(57) ABSTRACT

A display panel, a circuit board and a display device are provided, belonging to the field of displays. The display panel has a display region and a binding region which is on at least one side of the display region, and the display panel includes: a substrate; a plurality of signal pins on the substrate and in the binding region, the signal pins being arranged at intervals in a first direction and being connected to the circuit board; and at least one non-signal pin on the substrate and between two adjacent signal pins.

17 Claims, 6 Drawing Sheets

(51) Int. Cl.
   *H10K 59/88*                    (2023.01)
   *H10K 59/179*                   (2023.01)

(52) U.S. Cl.
   CPC .. *H01L 2224/06515* (2013.01); *H10K 59/131*
                  (2023.02); *H10K 59/179* (2023.02)

(58) Field of Classification Search
   CPC ........ H10K 59/88; G01R 31/40; H01L 24/06;
                  H01L 2224/06155; H01L 2224/06515;
                  H05K 2201/055; H05K 1/189
   See application file for complete search history.

(56)                References Cited

U.S. PATENT DOCUMENTS

| | | | | |
|---|---|---|---|---|
| 10,403,689 | B2 * | 9/2019 | Park | G09G 3/3275 |
| 11,132,096 | B2 * | 9/2021 | Lee | G06F 3/0446 |
| 11,647,656 | B2 * | 5/2023 | Jeon | H10K 59/131 |
| | | | | 257/40 |
| 11,943,978 | B2 * | 3/2024 | Yamanaka | H10D 30/67 |
| 11,947,227 | B2 * | 4/2024 | Choi | G02F 1/13452 |
| 12,016,214 | B2 * | 6/2024 | Lee | H10D 86/443 |
| 2008/0117376 | A1 | 5/2008 | Takenaka | |
| 2008/0273003 | A1 * | 11/2008 | Jeon | G09G 3/3677 |
| | | | | 345/99 |
| 2012/0299888 | A1 | 11/2012 | Kim et al. | |
| 2015/0098197 | A1 | 4/2015 | Abe et al. | |
| 2016/0181349 | A1 * | 6/2016 | Cho | H10K 59/88 |
| | | | | 257/40 |
| 2016/0270234 | A1 * | 9/2016 | Ahn | H05K 1/189 |
| 2019/0059156 | A1 | 2/2019 | Kwon et al. | |
| 2019/0115400 | A1 | 4/2019 | Park et al. | |
| 2021/0134897 | A1 * | 5/2021 | Choi | G02F 1/13452 |

FOREIGN PATENT DOCUMENTS

| | | | |
|---|---|---|---|
| CN | 109616480 | A | 4/2019 |
| CN | 110967880 | A | 4/2020 |
| CN | 111653604 | A | 9/2020 |
| IN | 101187735 | A | 5/2008 |

* cited by examiner

| ELVSS | ELVDD | dummy | PCD | dummy | S1 | dummy | VGH | dummy | ESTV | dummy | Mux | dummy | Eout |
|-------|-------|-------|-----|-------|----|-------|-----|-------|------|-------|-----|-------|------|

DISPLAY PANEL, CIRCUIT BOARD, AND DISPLAY DEVICE

CROSS-REFERENCE TO RELATED APPLICATION

The present application is a 371 of PCT Patent Application Serial No. PCT/CN2021/093623, filed on May 13, 2021, which claims priority to Chinese Patent Application No. 202010574749.2, filed on Jun. 22, 2020 and entitled "DISPLAY PANEL, CIRCUIT BOARD, AND DISPLAY DEVICE", the contents of both of which are incorporated herein by reference in their entirety.

TECHNICAL FIELD

The present disclosure relates to the field of displays, and more particularly, relates to a display panel, a circuit board, and a display device.

BACKGROUND

In the field of displays, integrated circuit (IC) packaging technologies usually relates to a chip on film (COF), chip on glass (COG), chip on Pi (COP) and the like. Taking the COF as an example, the COF refers to fixing an integrated circuit on a thin-film circuit board and binding the integrated circuit to a display panel through the thin-film circuit board.

SUMMARY

Embodiments of the present disclosure provide a display panel, a circuit board, and a display device.

In one aspect, a display panel is provided. The display panel has a display region and a binding region which is on at least one side of the display region, and the display panel includes:

a substrate;

a plurality of signal pins on the substrate and in the binding region, the signal pins being arranged at intervals in a first direction and being used to be connected to a circuit board; and at least one non-signal pin on the substrate and between two adjacent signal pins.

Optionally, in the case that the at least one non-signal pin is provided between two adjacent signal pins, the two signal pins satisfy the following condition that:

a voltage of at least one of the two adjacent signal pins exceeds a first threshold.

Optionally, in the case that the at least one non-signal pin is provided between two adjacent signal pins, the two signal pins satisfy the following condition that:

the difference between voltages of the two adjacent signal pins exceeds a second threshold.

Optionally, each of the signal pins includes a first signal pin and a second signal pin; and one non-signal pin is arranged between two adjacent first signal pins, and a plurality of non-signal pins is arranged between two adjacent second signal pins.

Optionally, the number of the non-signal pins arranged between the two adjacent signal pins is positively correlated with the voltage of the signal pin having a higher voltage of the two signal pins;

or, the number of the non-signal pins arranged between the two adjacent signal pins is positively correlated with the different between the voltages between the two signal pins.

Optionally, the two adjacent signal pins are respectively a common voltage signal pin and a test pin; and two non-signal pins are arranged between the common voltage signal pin and the test pin.

Optionally, the two adjacent signal pins are respectively a power supply voltage pin and a test pin; and three non-signal pins are arranged between the power supply voltage pin and the test pin.

Optionally, the two adjacent signal pins are respectively a power supply voltage pin and a panel crack detection signal pin; and four non-signal pins are arranged between the power supply voltage pin and the panel crack detection signal pin.

Optionally, the two adjacent signal pins are respectively a common voltage signal pin and a panel crack detection signal pin; and four non-signal pins are arranged between the common voltage signal pin and the panel crack detection signal pin.

Optionally, the two adjacent signal pins are respectively:

a data signal pin and a gate high-level signal pin;

or, a test control switch signal pin and the gate low-level signal pin;

or, the gate low-level signal pin and an initialization voltage signal pin;

or, the initialization voltage signal pin and a light emission control clock signal pin;

or, a start signal pin and a switch selection signal pin;

or, the switch selection signal pin and a detection feedback signal pin;

or, a light emission control detection feedback signal pin and a gate detection feedback signal pin;

or, a gate clock signal pin and the gate low-level signal pin;

or, the gate low-level signal pin and the gate high-level signal pin; and the non-signal pin is arranged between every two adjacent signal pins.

Optionally, the signal pins includes at least one group of the following signal pins:

two adjacent signal pins of the same type;

a panel crack detection signal pin, a conductive particle compression detection signal pin and a data signal pin which are adjacent;

a gate high-level signal pin and a test control switch signal pin which are adjacent;

a light emission control clock signal pin, a light emission control second clock signal pin and a light emission control start signal pin which are adjacent; and a gate start signal pin, a gate second clock signal pin and a gate clock signal pin which are adjacent.

Optionally, a space between any two adjacent pins among both the signal pins and the at least one non-signal pin is within a predetermined distance range.

Optionally, the signal pins include:

a power supply voltage pin and a common voltage signal pin; and in the first direction, the pin widths of the power supply voltage pin and the common voltage signal pin are larger than the widths of the other signal pins.

In another aspect, a display device is provided. The display device includes the display panel as described in any one of the foregoing aspects.

In another aspect, a circuit board is provided. The circuit board includes:

a plurality of signal pins arranged at intervals in a first direction and used to be connected to a display panel; and at least one non-signal pin disposed between two adjacent signal pins.

Optionally, in the case that the at least one non-signal pin is provided between two adjacent signal pins, the two signal pins satisfy the following condition that:

a voltage of at least one of the two adjacent signal pins exceeds a first threshold.

Optionally, in the case that the at least one non-signal pin is provided between two adjacent signal pins, the two signal pins satisfy the following condition that:

the difference between voltages of the two adjacent signal pins exceeds a second threshold.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

FIG. 10 is a schematic diagram of a positional relationship of some pins according to an embodiment of the present disclosure.

DETAILED DESCRIPTION

For clearer descriptions of the objectives, technical solutions, and advantages of the present disclosure, the embodiments of the present disclosure are described in detail hereinafter with reference to the accompanying drawings.

As mentioned above, COG, a COF and COP are three integrated circuit packaging methods, one of which is generally used in a display device to bind an integrated circuit to a display panel. The COF is taken as an example for description below.

Figure 1:
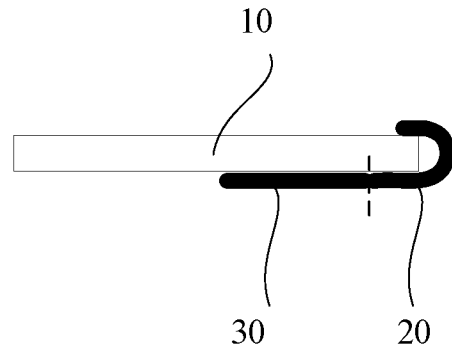
FIG. 1 shows a schematic diagram of binding of a display panel and a COF together according to an embodiment of the present disclosure.

FIG. 1 shows a schematic diagram of binding of a display panel and a COF together according to an embodiment of the present disclosure. As shown in FIG. 1, the display panel 10 and the COF 20 are bound in a binding region of the display panel 10, and the binding region is disposed at the edge of the display panel 10. When the COF is bound to the display panel 10, the COF and the display panel may be in a line. The COF is bent upon the binding to enable the COF to be bent back below the display panel 10, and then bound to a flexible printed circuit (FPC) 30. Upon the back bending and the binding shown in FIG. 1, the COF and the FPC may be fixed by adhering the COF and the FPC to the display panel 10 through an adhesive.

Figure 2:
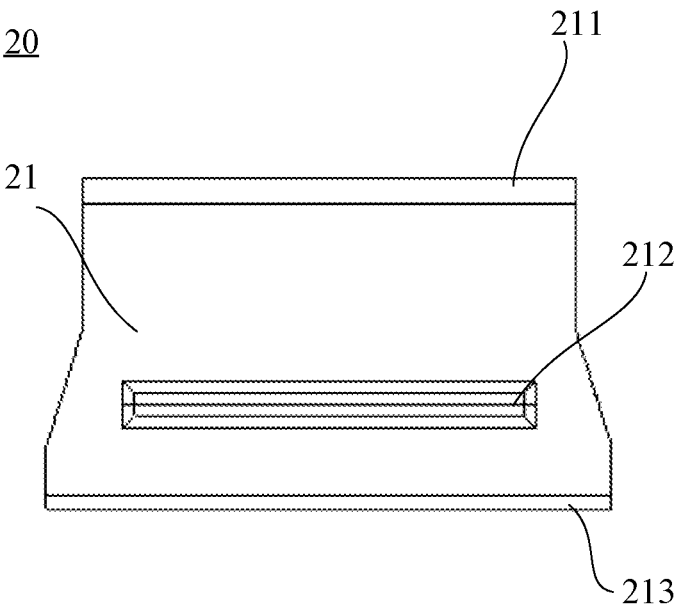
FIG. 2 shows a schematic structural diagram of a COF according to an embodiment of the present disclosure.

FIG. 2 shows a schematic structural diagram of a COF according to an embodiment of the present disclosure. Referring to FIG. 2, the COF 20 includes a thin-film circuit board body 21, namely, a thin film for the COF.

The COF further includes a first inner pin 211, a driver integrated circuit (DIC) 212 and a first outer pin 213 which are on the thin-film circuit board body 21. The first inner pin 211 is connected to the FPC, and the first outer pin 213 is connected to the binding region of the display panel 10.

Figure 3:
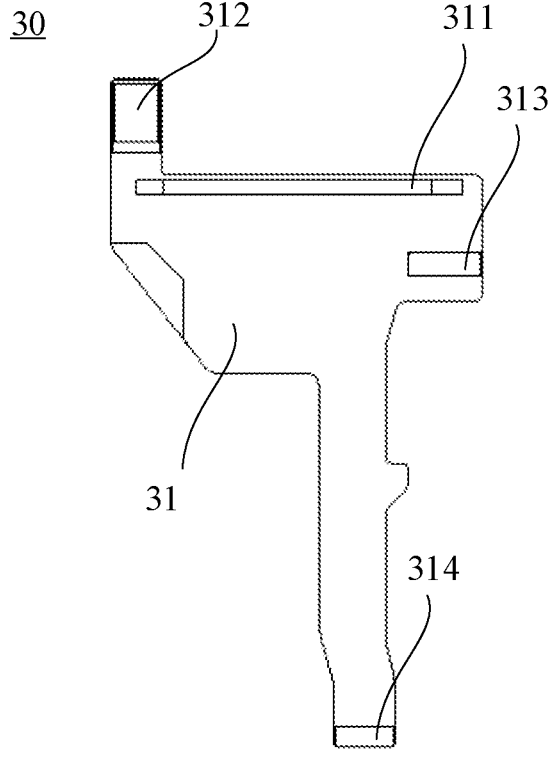
FIG. 3 shows a schematic structural diagram of an FPC according to an embodiment of the present disclosure.

FIG. 3 shows a schematic structural diagram of an FPC according to an embodiment of the present disclosure. Referring to FIG. 3, the FPC 30 includes a FPC body 31, namely, a thin film for the FPC.

The FPC further includes a second inner pin 311, a device region 312, a touch control binding region 313 and a second outer pin 314 which are on the FPC body 31. The device region 312 and the touch control binding region 313 are arranged between the second inner pin 311 and the second outer pin 314. The second inner pin 311 is connected to the COF 20, and the second outer pin 314 is connected to a main board of the display device. The device region 312 is also known as a component region, in which components such as a capacitor and a memory are integrated. The touch control binding region 313 is configured to be bound to a touch control circuit of the display panel.

Figure 4:
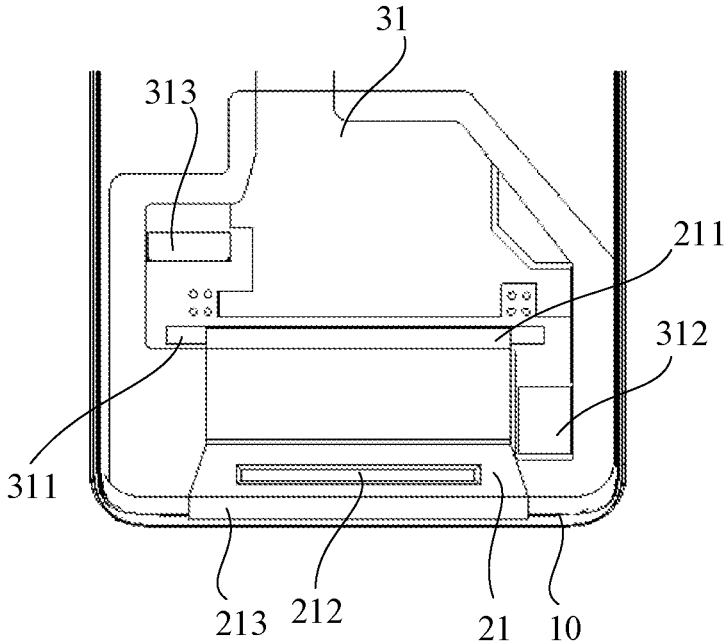
FIG. 4 shows a schematic diagram of an internal structure of a display device according to an embodiment of the present disclosure.

FIG. 4 shows a schematic diagram of an internal structure of a display device according to an embodiment of the present disclosure. Referring to FIG. 4, the first outer pin 213 of the COF is bound onto the display panel 10, and the first inner pin 211 of the COF is bound together with the second inner pin 311 of the FPC.

Here, the COF is bound to the binding region of the display panel 10, and is bent back to the other surface of the display panel 10 upon binding to the display panel 10.

In an exemplary embodiment, the display panel may be an organic light-emitting diode (OLED) display panel. The OLED display panel includes an active matrix OLED (AMOLED) and a passive matrix OLED (PMOLED). The solution provided by the present disclosure is mainly applicable to an AMOLED display panel. Of course, the display panel may also be other types of display panels such as a liquid crystal display panel and a miniature light-emitting diode display panel.

In a flexible wearable product such as a wristband and a watch, since the size of a display panel therein is generally relatively smaller, a unilaterally-driven signal routing solution is generally adopted. Thus, all signals are transmitted through COFs on the same side. Furthermore, the size of the COF in the flexible wearable product is also smaller, and accordingly, the size of any pin on the COF is smaller. The smaller the size is, the larger the resistance is. Under the condition of a certain electric current, the voltages on some pins are higher. In the case that the difference between voltages of two adjacent pins is larger, it is prone to short a circuit, adversely affecting the accuracy of the signals.

Figure 5:
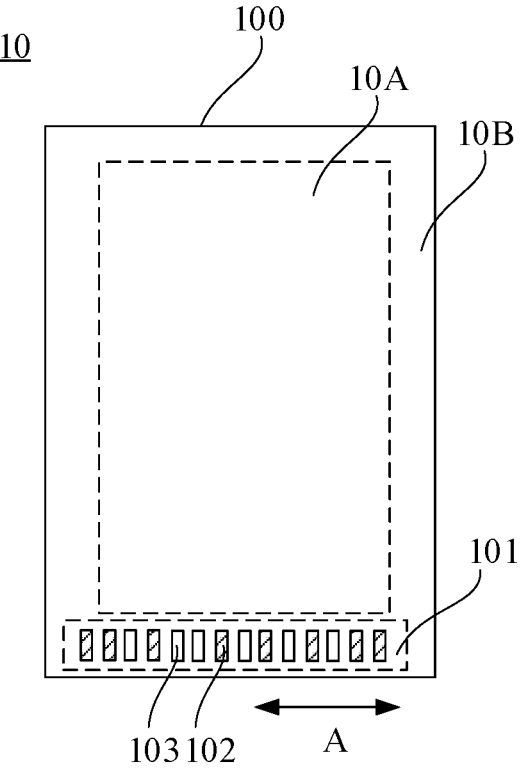
FIG. 5 is a schematic structural diagram of a display panel according to an embodiment of the present disclosure.

FIG. 5 is a schematic structure diagram of a display panel according to an embodiment of the present disclosure. Referring to FIG. 5, the display panel 10 has a display region 10A and a peripheral area 10B surrounding the display region 10A. The peripheral area 10B includes a binding region 101 disposed on at least one side of the display region 10A.

The display panel 10 may include a substrate 100, a plurality of signal pins 102 and at least one non-signal pin 103.

The plurality of signal pins 102 is on the substrate 100 and in the binding region 101. The signal pins 102 are arranged at intervals in the first direction A, and are connected to the circuit board. The non-signal pin 103 is on the substrate 100 and between the two adjacent signal pins 102.

As shown in FIG. 5, the binding region 101 may be on one side edge of the display panel, and its shape may be a long strip. The A direction may be an extension direction of the side edge, namely, the length direction of the binding region 101.

Figure 6:
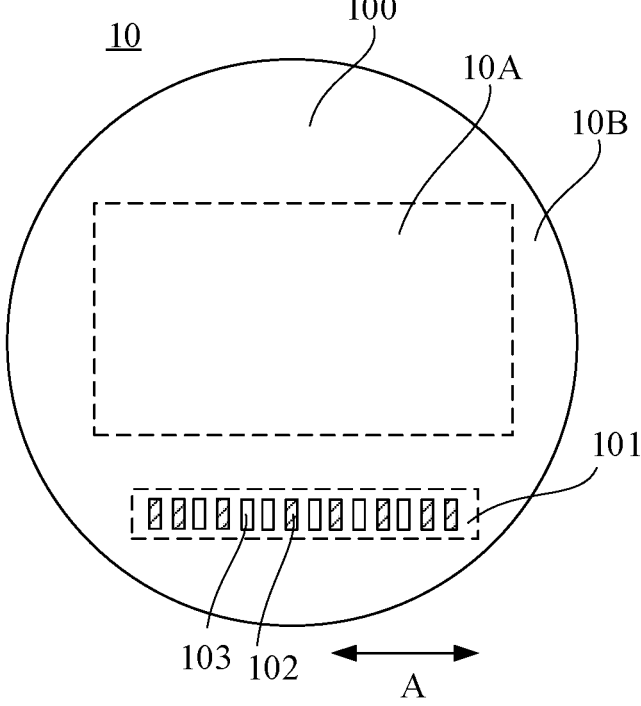
FIG. 6 is a schematic structural diagram of another display panel according to an embodiment of the present disclosure.

FIG. 6 is a schematic structural diagram of yet another display panel according to an embodiment of the present disclosure. Referring to FIG. 6, the display panel shown in FIG. 6 is a circular display panel. Although the display panel is circular, the design of the display region 10A and the binding region 101 in the display panel is similar to that in FIG. 5, both of which are rectangular. The first direction A is the length direction of the binding region 101.

Figure 7:
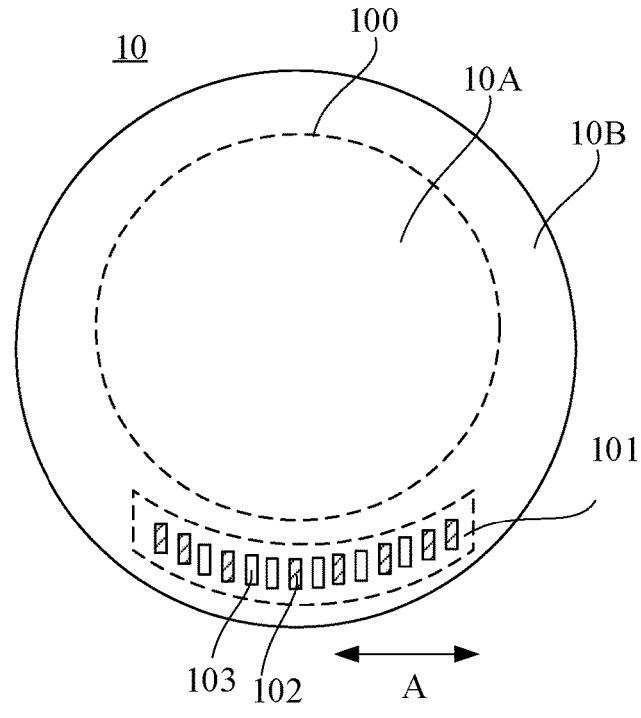
FIG. 7 is a schematic structural diagram of yet another display panel according to an embodiment of the present disclosure.

FIG. 7 is a schematic structural diagram of yet another display panel according to an embodiment of the present disclosure. Referring to FIG. 7, the display panel shown in FIG. 7 is a circular display panel, the display region 10A in the display panel (for example, a display panel in a watch) is circular, and the binding region 101 is arc-shaped. All of the pins may be arranged in the arc-shaped binding region 101 in the first direction A. Different from those shown in FIGS. 5 and 6, a line for connecting all of the pins may not be a straight line, and for example, may be an arc line shown in FIG. 7. The first direction A may refer to the tangential direction of the arc line.

Of course, the display panels provided in FIG. 5 to FIG. 7 are only examples. In other embodiments, the display panel may also be in other shapes besides the rectangle and the circle, and the design of the shapes of the display region and the binding region is not limited to those shown in the accompany drawings.

In the embodiment of the present disclosure, two adjacent signal pins 102 mean that in the first direction A, there is no another signal pin 102 between the two signal pins 102. For example, when there is no pin or only the non-signal pin 103 between the two signal pins 102, the two signal pins 102 are called the adjacent signal pins 102.

Here, the signal pin 102 is a pin configured to transmit a signal in practice, and the signal pin 102 is connected to a signal line. The non-signal pin 103, also called a dummy pin, is not connected to the signal line, and does not transmit an actual signal. The function of the non-signal pin 103 is to ensure the uniformity of surroundings of the pins while increasing the distance between the two adjacent pins (that is, there are two adjacent pins around each pin within a certain distance, which avoids a situation that there is no another pin around the signal pins within a certain distance caused by the increase of the distance between the adjacent signal pins). By providing the non-signal pin not connected to the signal substantially between the adjacent signal pins, the distance between the signal pins is increased, such that a short circuit between the pins can be avoided.

In the embodiment of the present disclosure, the materials of the signal pins 102 and the non-signal pin 103 are the same, which is convenient for fabrication. In other embodiments, the materials of the signal pins 102 and the non-signal pins 103 may be different, but generally, the non-signal pin 103 is still made of a conductive material.

If the display panel is a PMOLED display panel, the substrate 100 may be a base substrate. If the display panel is an AMOLED display panel, the substrate 100 is an array substrate, and the array substrate includes a base substrate and a pixel circuit on the base substrate.

In the AMOLED display panel, a plurality of sub-pixels is arranged in a display region. Each pixel includes a pixel circuit and a light-emitting element, and the pixel circuit is provided between the base substrate and the light-emitting element. The light-emitting element includes a first electrode, an organic light-emitting layer and a second electrode which are sequentially stacked. The second electrode is on one side of the organic light-emitting layer facing the base substrate. Here, the second electrode is an anode, and the first electrode is a cathode.

In another exemplary embodiment, the pixel circuit includes a 2T1C circuit, a 3T1C circuit, a 7T1C circuit and the like. Here, T represents a transistor and C represents a capacitor. In another exemplary embodiment, the transistor is a thin-film transistor.

Figure 8:
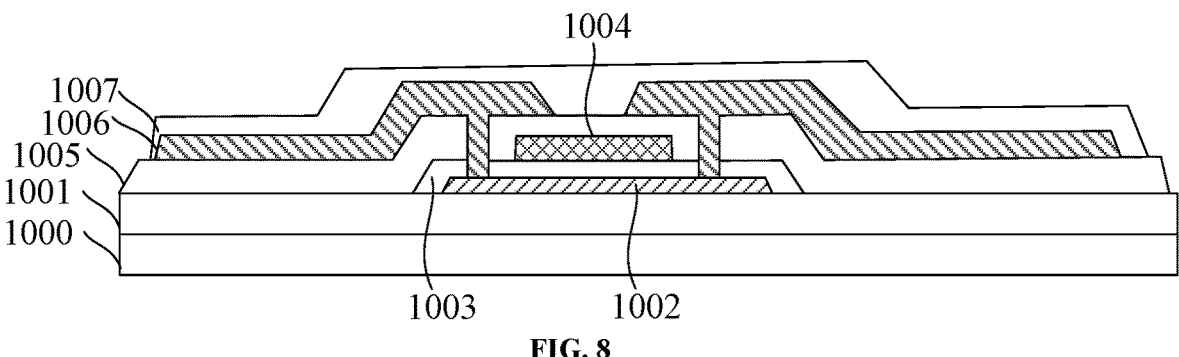
FIG. 8 is a schematic structural diagram of a thin-film transistor according to an embodiment of the present disclosure.

FIG. 8 is a schematic structural diagram of a thin-film transistor according to an embodiment of the present disclosure. Referring to FIG. 8, taking a top-gate-type thin-film transistor as an example, the thin-film transistor includes a buffer layer 1001, an active layer 1002, a gate insulating layer 1003, a first electrode layer 1004, an interlayer insulating layer 1005, a second electrode layer 1006 and a passivation layer 1007 which are sequentially stacked on the base substrate 1000. Here, the second electrode layer 106 is connected to the active layer 1002 through a via hole. In other embodiments, the thin-film transistor may also be a bottom-gate-type thin-film transistor or a double-gate-type thin-film transistor, which are not limited in the present disclosure.

In another exemplary embodiment, the base substrate is a transparent substrate, such as a glass substrate. The active layer material may be at least one of InGaZnO, InGaO, ITZO, and AlZnO. The buffer layer, the gate insulating layer and the interlayer insulating layer may be made of an insulating material such as silicon nitride and silicon oxide. The material of the passivation layer is of a composite layer structure composed of any combination of two or more of silicon oxide, silicon nitride and a silicon nitride compound. The first electrode layer and the second electrode layer are layers of metal such as Al (aluminum), Cu (copper), Mo (molybdenum), Cr (chromium), Ti (titanium), and the like, or alloy electrode layers.

In another exemplary embodiment, the first electrode layer is a gate layer, and the second electrode layer is a source and drain layer.

The display panel according to the embodiments of the present disclosure may be applicable to the flexible wearable product such as the wristband and the watch. The size of the flexible wearable product is generally relatively smaller, and thus, it is usually prone to cause a short circuit between non-data signal pins (including a gate pin and a light emission control pin, such as a common voltage signal pin, a power supply voltage pin, a gate high-level signal pin, a gate low-level signal pin, a light emission control start signal pin, a gate detection feedback signal pin, and a switch selection signal pin). Due to the small size of the flexible wearable product, in an implementation of the embodiment of the present disclosure, it is not necessary to provide at least one non-signal pin between every two non-data signal pins. Furthermore, not every two adjacent signal pins is provide with the non-signal pin therebetween, and the non-signal pins are only arranged between some of the groups of two adjacent signal pins.

In another exemplary embodiment, in the case that the at least one non-signal pin 103 is provided between two adjacent signal pins 102, the two signal pins 102 satisfy at least one of the following conditions that:

the voltage of at least one of the two adjacent signal pins 102 exceeds a first threshold; and the difference between voltages of the two adjacent signal pins 102 exceeds a second threshold.

Here, the voltage of the signal pin 102 refers to a voltage value of the signal pin 102 when a signal is loaded to the signal pin 102.

Here, two solutions in which the non-signal pin is provided are defined. One is that the voltage of at least one of two adjacent signal pins exceeds the first threshold. In this case, since the voltage of one signal pin is too high, it is prone to cause a short circuit with the surrounding signal pins, resulting in a corrosion risk of a signal line connected to the pins. In the other solution, the different between the voltages of the two signal pins is too large, in this case, it is prone to cause the short circuit between the signal pins, resulting in the corrosion risk of the signal line connected to the pins. In order to avoid the short circuit of the signal pins in the two cases, the non-signal pin is additionally provided between the two signal pins.

In another exemplary embodiment, the first threshold and the second threshold may be determined based on voltages of all signals transmitted by the respective signal pins. For example, the first threshold may be the median or the average of the voltages of all of the signals transmitted by the respective signal pins. The first threshold value and the second threshold value may also be considered based on other factors, such as the threshold of a voltage that is likely to cause a short circuit. The values of the first threshold and the second threshold may be the same or different.

In other embodiments, even if the two adjacent signal pins do not meet the above conditions, a non-signal pin may be provided between two adjacent signal pins.

In other implementations, a non-signal pin is provided between every two adjacent signal pins.

No matter which implementation is adopted, it is required to discard some unnecessary signal pins, such as an electric current dynamic change detection signal pin, in the case of additionally providing the non-signal pin as the size of the flexible wearable product is smaller. Of course, the signal pin that needs to be discarded may be determined based on an actual situation. In the case that the original pin design solutions are different, the signal pins required to be discarded are also different. Only the reserved signal pins are described later.

In the embodiment of the present disclosure, a space between any two adjacent pins among both the signal pins 102 and the at least one non-signal pin 103 is within a predetermined distance range. By enabling the space between any two adjacent pins to be within the predetermined distance range, it can be ensured that the environments around each of the signal pins are basically the same, thereby ensuring the uniformity of the signals.

As shown in FIG. 5 to FIG. 7, the space between two adjacent pins is a fixed value. That is, all of the two adjacent pins are equally spaced.

By enabling all of the two adjacent pins to be equally spaced, it can be ensured that the environments around each of the signal pins are basically the same, further ensuring the uniformity of the signals.

In other implementations, the spaces between all of the two adjacent pins may be different.

As shown in FIG. 5 to FIG. 7, in the case that the non-signal pin 103 is provided between the two adjacent signal pins 102, the number of the non-signal pins 103 is one or more.

In another exemplary embodiment, the signal pin 102 includes a first signal pin and a second signal pin; one non-signal pin 103 is arranged between every two adjacent first signal pins, and a plurality of non-signal pins 103 is arranged between every two second signal pins.

In another exemplary embodiment, the number of the non-signal pins 103 arranged between every two adjacent signal pins 102 is positively correlated with the voltage of the signal pin 102 having the higher voltage in the two signal pins 102, or is positively correlated with the difference between the voltages of the two signal pins 102. Here, the positive correlation means that: the higher the voltage of the signal pin 102 having the higher voltage in the two signal pins 102 is, the larger the number of the non-signal pins 103 between the two signal pins 102 is; the lower the voltage of the signal pin 102 having the higher voltage in the two signal pins 102 is, the less the number of the non-signal pins 103 between the two signal pins 102 is; the greater the difference between the voltages of the two signal pins 102 is, the larger the number of the non-signal pins 103 between the two signal pins 102 is; and the smaller the difference between the voltages of the two signal pins 102 is, the less the number of the non-signal pins 103 between the two signal pins 102 is. The higher the voltage or the greater the different between the voltages is, the longer the distance is required to avoid a short circuit.

In another exemplary embodiment, the voltage or the different between the voltages may be divided into a plurality of ranges, each of which corresponds to a kind of number of non-signal pins. Taking the different between the voltages as an example, in the case that the different between the voltages is within a first range, no non-signal pin is provided between the two signal pins 102. In the case that the different between the voltages is within a second range, one non-signal pin is provided between the two signal pins 102. In the case that the different between the voltages is within a third range, two non-signal pins are provided between the two signal pins 102. In the case that the different between the voltages is within a fourth range, three non-signal pins are provided between the two signal pins 102. In the case that the different between the voltages is within a fifth range, four non-signal pins are provided between the two signal pins 102. The difference between the voltages from 0 to infinity is sequentially divided into five ranges: the first range to the fifth range.

In another exemplary embodiment, the two adjacent signal pins 102 are respectively a VSS (or called ELVSS) pin and a TP; and the non-signal pin 103 is provided between the VSS pin and the TP.

Here, VSS represents a common voltage signal; and TP represents the test pin, and includes a TP_L (left) and TP_R (right).

In another exemplary embodiment, the two non-signal pins 103 are provided between the VSS pin and the TP.

In another exemplary embodiment, the two adjacent signal pins 102 are respectively a VDD (or called ELVDD) pin and the TP; and the non-signal pin 103 is provided between the VDD pin and the TP.

Here, VDD represents a power supply voltage signal.

In another exemplary embodiment, three non-signal pins 103 are provided between the VDD pin and the TP.

In another exemplary embodiment, the two adjacent signal pins 102 are respectively the VDD pin and a PCD pin; and the non-signal pin 103 is provided between the VDD pin and the PCD pin.

In another exemplary embodiment, four non-signal pins 103 are provided between the VDD pin and the PCD pin.

Here, PCD represents a panel crack detection signal. A coil around the display region may be disposed in the peripheral region of the display panel. When the display panel is cracked upon falling, the coil is disconnected. At this time, the PCD signal changes, such that it can be determined that the display panel is broken and cracked. Generally, a small-sized flexible device is not provided with the PCD pin; while by providing the PCD pin in the present disclosure, a crack in a panel of the small-sized flexible device can be detected.

In another exemplary embodiment, the two adjacent signal pins 102 are respectively a VSS pin and the PCD pin; and the non-signal pin 103 is provided between the VSS pin and the PCD pin.

In another exemplary embodiment, four non-signal pins 103 are provided between the VSS pin and the PCD pin.

In another exemplary embodiment, the two adjacent signal pins 102 are respectively:

a source pin and a VGH pin;

or, a CTSW pin and a VGL pin;

or, the VGL pin and a VREFN pin;

or, the VREFN pin and an ECK pin;

or, a STV pin (including an ESTV pin and a GSTV pin) and a MUX pin;

or, the MUX pin and an Out pin (including an Eout pin and a Gout pin);

or, the Eout pin and the Gout pin;

or, a GCK pin and a VGL pin;

or, the VGL pin and the VGH pin.

The non-signal pin 103 is arranged between any two adjacent signal pins 102 mentioned above.

Here, Source represents a data signal; voltage gate high (VGH) represents a gate high-level signal; voltage gate low (VGL) represents a gate low-level signal; cell test switch (CTSW) represents a test control switch signal applicable to a lighting test for an OLED; VREFN represents an initialization voltage signal; emission clock (ECK) represents a light emission control clock signal; gate clock (GCK) represents a gate clock signal; emission start vertical (ESTV) represents a light emission control start signal; gate start vertical (GSTV) represents a gate start signal; multiplexer (MUX) represents a switch selection signal; emission out (Eout) represents a light emission control detection feedback signal (which is configured to feed a light emission control signal of the display panel back to an IC to check whether the display panel is normal); gate out (Gout) represents a gate detection feedback signal (which is configured to feed a gate signal of the display panel back to the IC to detect whether the display panel is normal).

In another exemplary embodiment, the plurality of signal pins 102 includes at least one group of the following signal pins 102:

two adjacent signal pins 102 of the same type;

the PCD pin, a WINDOW pin and the Source pin which are adjacent;

the VGH pin and CTSW pin which are adjacent;

the ECK pin, an ECB pin and the ESTV pin which are adjacent; and the GSTV pin, the GCB pin and the GCK pin which are adjacent.

No non-signal pin 103 is arranged between any two adjacent signal pins 102 mentioned above.

Here, WINDOW represents a conductive particle compression detection signal pin which is configured to detect a crack in a conductive particle (such as an ACF) to avoid a short circuit caused by the conductive particle; emission clock B (ECB) represents a light emission control second clock signal which is complementary to the light emission control clock signal; and gate clock B (GCB) represents a gate second clock signal which is complementary to the gate clock signal.

Table 1 below provides an arrangement for the pins, see Table 1:

TABLE 1

| Serial No. | Name |
|---|---|
| 1 | ELVSS |
| 2 | ELVSS |
| 3 | ELVSS |
| 4 | ELVSS |
| 5 | ELVSS |
| 6 | ELVSS |
| 7 | ELVSS |
| 8 | ELVSS |
| 9 | ELVSS |
| 10 | ELVSS |
| 11 | dummy |
| 12 | dummy |
| 13 | TP_L_1 |
| 14 | TP_L_2 |
| 15 | dummy |
| 16 | dummy |
| 17 | dummy |
| 18 | ELVDD |
| 19 | ELVDD |
| 20 | ELVDD |
| 21 | ELVDD |
| 22 | ELVDD |
| 23 | ELVDD |
| 24 | ELVDD |
| 25 | ELVDD |
| 26 | ELVDD |
| 27 | ELVDD |
| 28 | ELVDD |
| 29 | dummy |
| 30 | dummy |
| 31 | dummy |
| 32 | dummy |
| 33 | PCD |
| 34 | Window |
| 35 | s1 |
| ... | ... |
| 81 | s47 |
| 82 | dummy |
| 83 | dummy |
| 84 | VGH |
| 85 | VGH |
| 86 | CTSW |
| 87 | dummy |
| 88 | VGL |
| 89 | VGL |
| 90 | dummy |

TABLE 1-continued

| Serial No. | Name |
| --- | --- |
| 91 | VREFN |
| 92 | VREFN |
| 93 | VREFN |
| 94 | VREFN |
| 95 | dummy |
| 96 | dummy |
| 97 | dummy |
| 98 | ECK |
| 99 | ECB |
| 100 | ESTV |
| 101 | dummy |
| 102 | dummy |
| 103 | MUX3 |
| 104 | MUX2 |
| 105 | MUX1 |
| 106 | dummy |
| 107 | Eout |
| 108 | dummy |
| 109 | dummy |
| 110 | GOUT |
| 111 | dummy |
| 112 | MUX4 |
| 113 | MUX5 |
| 114 | MUX6 |
| 115 | dummy |
| 116 | dummy |
| 117 | GSTV |
| 118 | GCB |
| 119 | GCK |
| 120 | dummy |
| 121 | dummy |
| 122 | VGL |
| 123 | VGL |
| 124 | dummy |
| 125 | VGH |
| 126 | VGH |
| 127 | VGH |
| 128 | dummy |
| 129 | s48 |
| . . . | . . . |
| 175 | s94 |
| 176 | WINDOW |
| 177 | PCD |
| 178 | dummy |
| 179 | dummy |
| 180 | dummy |
| 181 | dummy |
| 182 | ELVDD |
| 183 | ELVDD |
| 184 | ELVDD |
| 185 | ELVDD |
| 186 | ELVDD |
| 187 | ELVDD |
| 188 | ELVDD |
| 189 | ELVDD |
| 190 | ELVDD |
| 191 | ELVDD |
| 192 | ELVDD |
| 193 | dummy |
| 194 | dummy |
| 195 | dummy |
| 196 | TP_R_2 |
| 197 | TP_R_1 |
| 198 | dummy |
| 199 | dummy |
| 200 | ELVSS |
| 201 | ELVSS |
| 202 | ELVSS |
| 203 | ELVSS |
| 204 | ELVSS |
| 205 | ELVSS |
| 206 | ELVSS |
| 207 | ELVSS |
| 208 | ELVSS |
| 209 | ELVSS |

The serial No. indicates the order of the pins. For example, the pins may be arranged from left to right in the binding region in the order of serial numbers from 1 to 209, or from right to left in the order of serial numbers from 1 to 209.

Here, the Source pins include 94 pins, namely s1 pin to s94 pin. 94 Source pins cooperate with a plurality of MUXs to drive thousands of data lines in the display panel. For example, one channel of switch signals corresponds to a group of selection switches, and one switch may output one channel of Sources to two data lines in a time-sharing fashion, such that the number of the Source pins is reduced by half. The plurality of MUXs may correspond to more groups of selection switches, such that larger-scale multiplexing can be realized. By providing the MUXs, the number of the Source pins can be greatly reduced, thereby ensuring that size requirements of small-sized flexible devices can be met.

In the AMOLED display panel, a shift register is arranged on an array substrate (i.e., a gate on array (GOA)). The shift register converts the STV, CLK, VGL, VGH and other signals provided by the IC into multiple channels of gate level signals that can drive gate lines. Thus, the binding region only need the pins for signals such as STV, CLK, VGL and VGH, and it is not necessary to provide pins to each row of gate lines.

Of course, Table 1 only shows an example of a pin arrangement. In a process of designing pins of a small-sized flexible wearable product, the number of the pins and specific pins may be determined based on the product size and the process condition.

Figure 9:
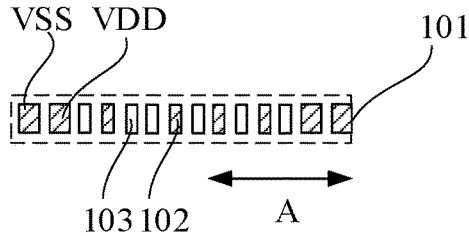
FIG. 9 is a schematic diagram of another arrangement for pins according to an embodiment of the present disclosure.

FIG. 9 is a schematic diagram of another arrangement for pins according to an embodiment of the present disclosure. Referring to FIG. 9, in the first direction A, the pin widths of the VDD pin and the VSS pin are larger than the pin widths of the other signal pins 102.

Usually, prior to binding, the alignment is performed based on the VDD pin and the VSS pin; and thus, to facilitate alignment in binding, the provided VDD pin and VSS pin are required to be larger. In addition, the wider the VSS pin and the VDD pin are, the lower the voltages of them are. Thus, it is not required to provide the non-signal pin between adjacent VDD pins or between adjacent VSS pins.

It should be noted that FIG. 9 is only for illustration, and usually, other pins may be provided between the VSS pin and the VDD pin, which can be seen in Table 1 for details.

Figure 10:
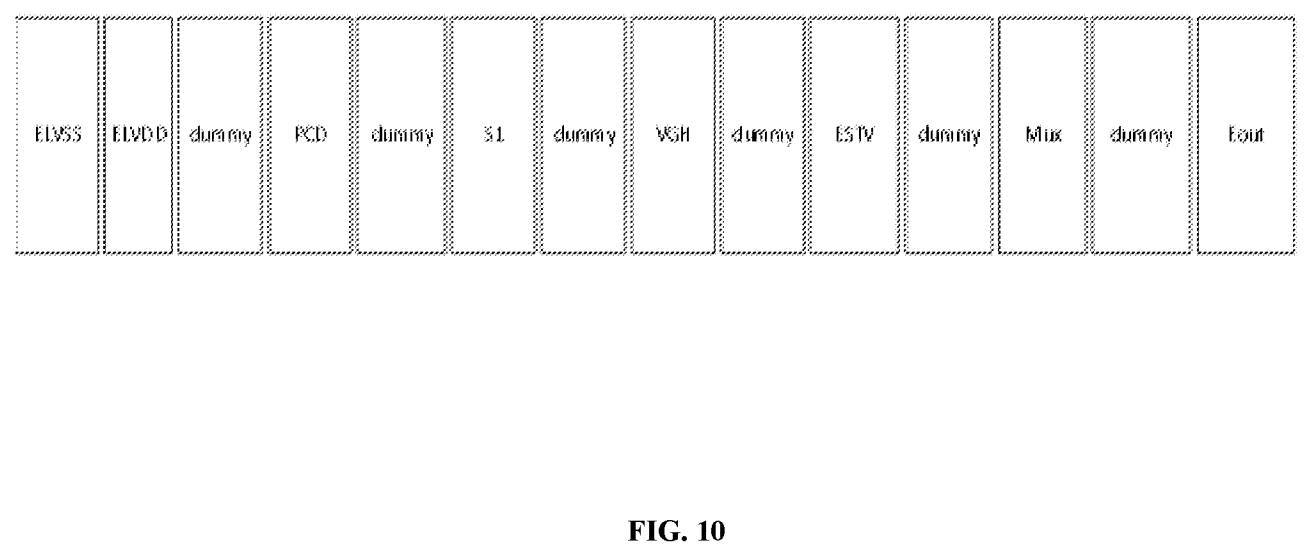

FIG. 10 is a schematic diagram of a positional relationship of some pins according to an embodiment of the present disclosure. Referring to FIG. 10, the PCD pin is on the inner sides of the VSS pin and the VDD pin. That is, the PCD pin is more proximal to the center of the binding region compared with the VSS pin and the VDD pin. By enabling the additionally provided PCD pin to be more proximal to the center of the binding region, a situation that the PCD pin and the VDD pin are too closer is avoided.

Generally, in a process of binding and crimping, the alignment is performed based on the VSS pin and the VDD pin, wherein the PCD pin is disposed between the VSS pin and the VDD pin and is prevented from being more proximal to the VDD pin, and the VSS pin and the VDD pin are disposed at the edges. It is easier to realize the alignment in the binding and crimping from the edges, such that a crimping risk (referring to misalignment of pins between a circuit board and a display panel) can be avoided.

A display device is provided according to an embodiment of the present disclosure. The display device includes the display panel as shown in FIGS. 1 to 10.

In the embodiments of the present disclosure, the display device includes, but is not limited to, flexible wearable products such as wristbands and watches.

Figure 11:
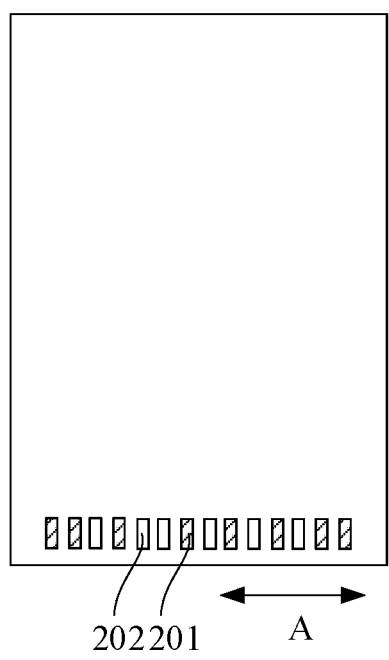
FIG. 11 is a schematic structural diagram of a circuit board according to an embodiment of the present disclosure.

FIG. 11 is a schematic structural diagram of a circuit board according to an embodiment of the present disclosure. Referring to FIG. 11, the circuit board includes: a plurality of signal pins 201 and at least one non-signal pin 202.

Here, the signal pins 201 are arranged at intervals in the first direction A, and are connected to the circuit board. The non-signal pin 202 is disposed between two adjacent signal pins 201.

FIG. 11 only shows an example of a pin arrangement. In the case that the display panel adopts an arc arrangement as shown in FIG. 7, the pins on the circuit board are arranged in an arc-shaped fashion accordingly.

The circuit board includes, but is not limited to, a COF circuit board, a COG circuit board, a COP circuit board or an FPC.

In the embodiments of the present disclosure, the arrangement for the pins of the circuit board may be the same as that for the pins of the display panel, and is not repeated herein.

Described above are merely exemplary embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. A display panel, wherein the display panel has a display region and a binding region which is on at least one side of the display region, and the display panel comprises:
    a substrate;
    a plurality of signal pins on the substrate and in the binding region, the signal pins being arranged at intervals in a first direction and being used to be connected to a circuit board; and
    at least one non-signal pin on the substrate and between two adjacent signal pins,
    wherein the signal pins comprise:
    a power supply voltage pin and a common voltage signal pin; wherein in the first direction, pin widths of the power supply voltage pin and the common voltage signal pin are larger than widths of the other signal pins.

2. The display panel according to claim 1, wherein in the case that the at least one non-signal pin is provided between two adjacent signal pins, the two signal pins satisfy the following condition that:
    a voltage of at least one of the two adjacent signal pins exceeds a first voltage threshold.

3. The display panel according to claim 1, wherein in the case that the at least one non-signal pin is provided between two adjacent signal pins, the two signal pins satisfy the following condition that:
    a difference between voltages of the two adjacent signal pins exceeds a second voltage threshold.

4. The display panel according to claim 1, wherein each of the signal pins comprises a first signal pin and a second signal pin; and
    one non-signal pin is arranged between two adjacent first signal pins, and a plurality of non-signal pins is arranged between two adjacent second signal pins.

5. The display panel according to claim 1, wherein the number of the non-signal pins arranged between the two adjacent signal pins is one of:
    positively correlated with a voltage of a signal pin having a higher voltage of the two signal pins; and positively correlated with a difference between the voltages of the two signal pins.

6. The display panel according to claim 5, wherein the two adjacent signal pins are respectively a common voltage signal pin and a test pin; and
    two non-signal pins are arranged between the common voltage signal pin and the test pin.

7. The display panel according to claim 5, wherein the two adjacent signal pins are respectively a power supply voltage pin and a test pin; and
    three non-signal pins are arranged between the power supply voltage pin and the test pin.

8. The display panel according to claim 5, wherein the two adjacent signal pins are respectively a power supply voltage pin and a panel crack detection signal pin; and
    four non-signal pins are arranged between the power supply voltage pin and the panel crack detection signal pin.

9. The display panel according to claim 5, wherein the two adjacent signal pins are respectively a common voltage signal pin and a panel crack detection signal pin; and
    four non-signal pins are arranged between the common voltage signal pin and the panel crack detection signal pin.

10. The display panel according to claim 5, wherein the two adjacent signal pins are one of the following groups of two pins:
    a data signal pin and a gate high-level signal pin;
    a test control switch signal pin and a gate low-level signal pin;
    the gate low-level signal pin and an initialization voltage signal pin;
    the initialization voltage signal pin and a light emission control clock signal pin;
    a start signal pin and a switch selection signal pin;
    the switch selection signal pin and a detection feedback signal pin;
    a light emission control detection feedback signal pin and a gate detection feedback signal pin;
    a gate clock signal pin and the gate low-level signal pin; and
    the gate low-level signal pin and the gate high-level signal pin;
    wherein at least one non-signal pin is arranged between every two adjacent signal pins.

11. The display panel according to claim 1, wherein the signal pins comprise at least one group of the following signal pins:
    two adjacent signal pins of the same type;
    a panel crack detection signal pin, a conductive particle compression detection signal pin and a data signal pin which are adjacent;
    a gate high-level signal pin and a test control switch signal pin which are adjacent;
    a light emission control clock signal pin, a light emission control second clock signal pin and a light emission control start signal pin which are adjacent; and
    a gate start signal pin, a gate second clock signal pin and a gate clock signal pin which are adjacent.

12. The display panel according to claim 1, wherein a space between any two adjacent pins among both the signal pins and the at least one non-signal pin is within a predetermined distance range.

13. A display device, comprising: the display panel according to claim 1.

14. A circuit board, comprising:

a plurality of signal pins arranged at intervals in a first direction and used to be connected to a display panel; and at least one non-signal pin disposed between two adjacent signal pins, wherein the signal pins comprise:

a power supply voltage pin and a common voltage signal pin; wherein in the first direction, pin widths of the power supply voltage pin and the common voltage signal pin are larger than widths of the other signal pins, wherein the number of the non-signal pins arranged between the two adjacent signal pins is one of:

positively correlated with a voltage of a signal pin having a higher voltage of the two signal pins; and positively correlated with a difference between the voltages of the two signal pins, wherein the two adjacent signal pins are respectively a power supply voltage pin and a test pin; and three non-signal pins are arranged between the power supply voltage pin and the test pin.

15. The circuit board according to claim 14, wherein the two signal pins satisfy one of the following condition that:

a voltage of at least one of the two adjacent signal pins exceeds a first voltage threshold; and a difference between voltages of the two adjacent signal pins exceeds a second voltage threshold.

16. The circuit board according to claim 14, wherein each of the signal pins comprises a first signal pin and a second signal pin; and one non-signal pin is arranged between two adjacent first signal pins, and a plurality of non-signal pins is arranged between two adjacent second signal pins.

17. The circuit board according to claim 14, wherein the two adjacent signal pins are respectively a power supply voltage pin and a panel crack detection signal pin; and four non-signal pins are arranged between the power supply voltage pin and the panel crack detection signal pin.

\* \* \* \* \*